US008541068B2

(12) United States Patent
Murase et al.

(10) Patent No.: US 8,541,068 B2
(45) Date of Patent: Sep. 24, 2013

(54) PROCESS FOR PRODUCING AN AMORPHOUS CARBON FILM

(75) Inventors: Hitotoshi Murase, Kariya (JP); Toshihisa Shimo, Kariya (JP); Shinfuku Nomura, Matsuyama (JP); Hiromichi Toyota, Matsuyama (JP); Hiroshi Yamashita, Matsuyama (JP); Makoto Kuramoto, Matsuyama (JP)

(73) Assignees: Kabushiki Kaisha Toyota Jidoshokki, Aichi-Ken (JP); Ehime Univeristy, Ehime-Ken (JP)

( * ) Notice: Subject to any disclaimer, the term of this patent is extended or adjusted under 35 U.S.C. 154(b) by 436 days.

(21) Appl. No.: 11/887,704

(22) PCT Filed: Mar. 27, 2006

(86) PCT No.: PCT/JP2006/306997
§ 371 (c)(1),
(2), (4) Date: Dec. 23, 2008

(87) PCT Pub. No.: WO2006/107002
PCT Pub. Date: Oct. 12, 2006

(65) Prior Publication Data
US 2009/0123657 A1      May 14, 2009

(30) Foreign Application Priority Data

Mar. 30, 2005   (JP) ................... 2005-099837

(51) Int. Cl.
*H05H 1/24*       (2006.01)
*C23C 16/00*      (2006.01)
*B05D 1/18*       (2006.01)

(52) U.S. Cl.
USPC .................. 427/569; 427/595; 427/430.1

(58) Field of Classification Search
USPC ............................................. 427/569, 430.1
See application file for complete search history.

(56) References Cited

U.S. PATENT DOCUMENTS

| 4,954,365 | A | * | 9/1990 | Neifeld | 427/554 |
| 5,246,198 | A | * | 9/1993 | Kurihara | 249/114.1 |
| 5,455,081 | A | * | 10/1995 | Okada et al. | 427/528 |
| 7,067,204 | B2 | * | 6/2006 | Nomura et al. | 428/698 |
| 2003/0052011 | A1 | * | 3/2003 | Chen | 205/80 |

FOREIGN PATENT DOCUMENTS

| JP | 2003-297598 | 10/2003 |
| JP | 2004-152430 | 4/2004 |
| JP | 2004-512430 | 4/2004 |
| JP | 2004-152523 | 5/2004 |
| WO | WO 03/086615 | 10/2003 |

OTHER PUBLICATIONS

Computer Translation of JP 2004-152523.*
English translation of the International Preliminary Report on Patentability dated Mar. 6, 2008, Application No. PCT/JP2006/306997.
Notification of Reasons for Refusal for Japanese Application No. 2007-511222, dated Jul. 26, 2011 (with English translation).

* cited by examiner

*Primary Examiner* — David Turocy
(74) *Attorney, Agent, or Firm* — Locke Lord LLP

(57) ABSTRACT

The process for producing an amorphous carbon film of the present invention is a process for producing an amorphous carbon film comprising contacting a surface of a substrate S with bubbles B which have been formed in a liquid L containing an organic compound and inside which plasma has been generated, so as to form an amorphous carbon film on the surface of the substrate S, and the liquid L contains one or more selected from phenols and alcohols having a carbon number of from 1 to 12. According to the present invention, a hard amorphous carbon film can be formed easily.

18 Claims, 3 Drawing Sheets

PROCESS FOR PRODUCING AN AMORPHOUS CARBON FILM

TECHNICAL FIELD

The present invention relates to a process for forming a coating film on a surface of a substrate in order to render abrasion resistance or other characteristics and particularly to a process for forming an amorphous carbon film as a coating film.

TECHNICAL BACKGROUND

Because underground carbon resources are almost unlimited and carbon is harmless, carbon is an excellent material in view of resources problems and environmental problems. As carbon materials, a variety of crystal structures are known such as diamond, diamond-like carbon, graphite, fullerene, and carbon nanotube, depending on types of bonds between atoms. Particularly, diamond-like carbon (amorphous carbon) having an amorphous structure attracts attention as functional materials which are superior in mechanical properties such as abrasion resistance and solid lubricating ability and have insulation properties, visible light/infrared light transmittance, low permittivity, oxygen barrier properties and so on in combination, and its applications are expected in various industrial fields.

In general, amorphous carbon is formed on a surface of a substrate by chemical vapor deposition (CVD) or physical vapor deposition (PVD). For example, by plasma CVD, which is one of CVD techniques, an amorphous carbon film is formed by activating a carbon-containing raw material gas into a plasma state and depositing a reaction product on a surface of a substrate.

In addition to the above techniques, Japanese Unexamined Patent Publication Nos. 2003-297,598 and 2004-152,523 disclose generating bubbles in a liquid hydrocarbon (dodecane: $C_{12}H_{26}$) and generating plasma in the bubbles, thereby activating dodecane and forming an amorphous carbon film on a surface of a substrate.

DISCLOSURE OF THE INVENTION

According to Japanese Unexamined Patent Publication Nos. 2003-297,598 and 2004-152,523, bubbles are generated in dodecane, which is a raw material. Namely, peripheries of bubbles inside which plasma is to be generated are surrounded by a liquid raw material. When plasma is generated in the bubbles, dodecane is efficiently activated because the raw material is supplied at a higher density than the raw material in a gaseous state. As a result, the amount of amorphous carbon to be deposited on a surface of a substrate per unit time by this technique is remarkably larger than that of general CVD. In other words, a rate of forming an amorphous carbon film is remarkably higher. However, according to the description of Japanese Unexamined Patent Publication No. 2004-152,523, for instance, due to a rapid film forming rate of 9 mm/h (about 1.7 μm/sec), it is difficult to control film thickness or form an extremely thin film of nanometer order.

Moreover, when hydrocarbons comprising large molecules having a large carbon number are employed, the large molecules tend to be polymerized in plasma without being dissolved completely. Therefore, a carbon film containing much hydrogen and having a polymer-like structure is deposited on a surface of a substrate. On the other hand, when hydrocarbons comprising small molecules having a small carbon number are employed, the hydrocarbons are completely dissolved in plasma and a carbon film mainly of a diamond structure is formed, and thus a hard amorphous carbon film can be obtained. However, since the boiling point decreases as the quantity of molecules diminishes, there are few hydrocarbons which have a small quantity of molecules and are in liquid form at room temperature. Therefore, hydrocarbons are not suitable to form a hard amorphous carbon film.

The present invention has been conceived in view of the above problems and it is an object of the present invention to provide a process for producing an amorphous carbon film which can form a hard amorphous carbon film easily.

The process for producing an amorphous carbon film of the present invention is a process for producing an amorphous carbon film comprising contacting a surface of a substrate with bubbles which have been formed in a liquid containing an organic compound and inside which plasma has been generated, so as to form an amorphous carbon film on the surface of the substrate and is characterized in that the liquid contains one or more selected from phenols and alcohols having a carbon number of from 1 to 12.

In the process for producing an amorphous carbon film of the present invention, bubbles are formed in a liquid containing an organic compound. In this case, inside the bubbles, the organic compound exists in the gaseous state. Radiation of electromagnetic waves or the like to these bubbles generates plasma inside the bubbles. The plasma generated inside the bubbles moves with the bubbles and comes in contact with a surface of a substrate placed in the liquid. Thus, carbon activated into a plasma state is deposited on the surface of the substrate to form an amorphous carbon film on the surface of the substrate.

According to the process for producing an amorphous carbon film of the present invention, the liquid contains one or more selected from phenols and alcohols having a carbon number of from 1 to 12. Alcohols and phenols are easy to handle in liquid form because some are singly in liquid form and some are highly soluble in water. For example, most alcohols which comprise small molecules having a small carbon number are in liquid form at room temperature. Therefore, a hard amorphous carbon film can be produced.

Here, "alcohols" are chemical compounds in which one or more hydrogen atoms of acyclic or alicyclic hydrocarbons are substituted for one or more hydroxyl groups (—OH). Moreover, "phenols" are chemical compounds in which one or more hydrogen atoms of aromatic hydrocarbon nuclei are substituted for one or more hydroxyl groups, and are not the name indicating carbolic acid ($C_6H_5OH$) alone.

The alcohols and the phenols are preferably in liquid form at room temperature. Moreover, the liquid is desirably an aqueous solution comprising water as a solvent and one or more selected from the alcohols and the phenols as a solute. When the alcohols and the phenols are employed as an aqueous solution, the amount of raw material to be activated by plasma can be regulated. As a result, a rate of forming a film can be adjusted. Moreover, if soluble in water, even alcohols and phenols in the solid state at room temperature can be suitably used in the process for producing an amorphous carbon film of the present invention.

Note that in a case of a mixed solution of a liquid and another liquid, the liquid in a larger amount is sometimes regarded as a solvent but in a case of "an aqueous solution" in this description, water is defined as a solvent, regardless of the amount of water used.

BEST MODE FOR CARRYING OUT THE INVENTION

Figure 1:
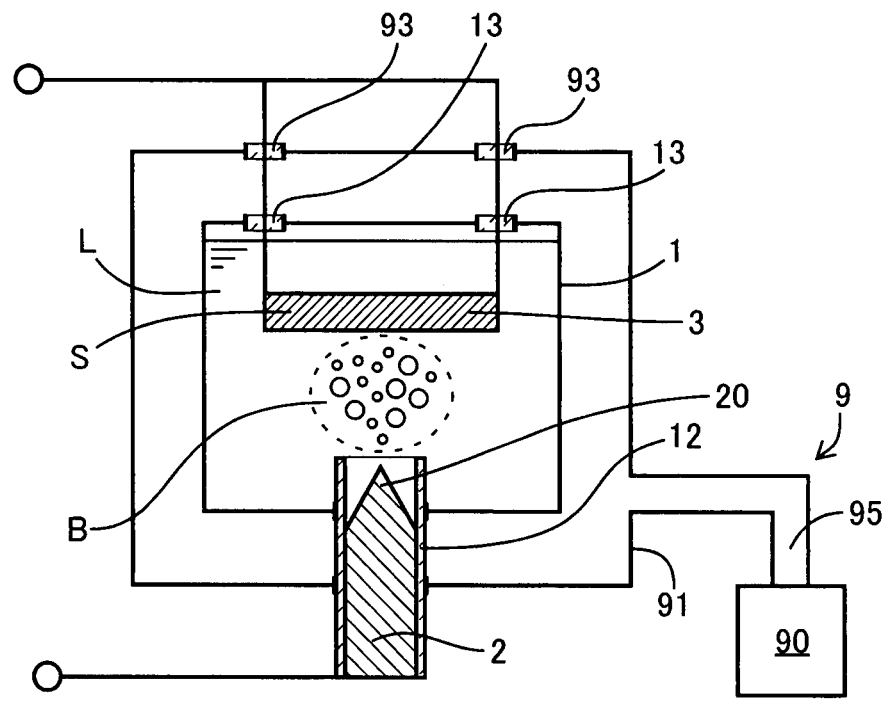
FIG. 1 is an explanatory view schematically showing a film forming apparatus used in the process for producing an amorphous carbon film of the present invention.

The best mode for carrying out this invention will be described in order to describe the present invention in more detail.

The process for producing an amorphous carbon film of the present invention employs a process comprising contacting a surface of a substrate with bubbles which have been formed in a liquid containing an organic compound and inside which plasma has been generated, so as to form an amorphous carbon film on the surface of the substrate.

In the above process, bubbles are formed in a liquid containing an organic compound. Examples of means for forming bubbles in a liquid include heating the liquid to a boil and radiating ultrasonic waves to the liquid. Means for forming bubbles can be, for example, to provide a heating element or an ultrasonic generator in a vessel for holding the liquid.

Plasma is generated inside the bubbles which have been formed in the liquid. Means for generating plasma is desirably to radiate short waves, medium waves, microwaves or other electromagnetic waves, X-rays, infrared rays, visible light ultraviolet rays or the like at a position in a liquid where bubbles are being formed. Particularly, it is preferable to employ electromagnetic waves and a desired frequency range of electromagnetic waves is from 13 MHz to 2.5 GHz. Inside the bubbles, an organic compound in the gaseous state exists at high temperatures and high pressures and plasma is easy to be generated. Therefore, upon radiation of electromagnetic waves or the like, plasma can be easily generated inside the bubbles.

The plasma which has been generated inside the bubbles moves with the bubbles and comes in contact with a surface of a substrate placed in the liquid. Thus, carbon activated into a plasma state is deposited on the surface of the substrate to form an amorphous carbon film. Note that the principle of how a gaseous organic compound is activated by plasma and deposited on the surface of the substrate is similar to that of conventional plasma CVD.

According to the above process, plasma at high temperatures and pressures is generated inside the bubbles, but since the bubbles are confined by liquid having a high heat capacity, the bubbles are macroscopically at low temperatures. Furthermore, owing to a cooling effect of liquid, film forming at low temperatures is possible. Note that film forming at high temperatures is also possible if means for heating the substrate is employed. Moreover, when the substrate is heated, the heat can also generate bubbles inside the liquid.

The material and shape of the substrate is not particularly limited. For example, the substrate can be formed of not only metals such as iron, aluminum, copper, titanium, magnesium and their alloys, but also ceramics or resins. Furthermore, since film forming at low temperatures is possible as mentioned above, a film can be formed on a substrate formed of such a material as paper and wood on which film forming has been difficult by conventional CVD. Besides, since the shape of the substrate is not particularly limited, a film can be formed on a variety of members.

Moreover, during the film forming process, the substrate only need to be placed with at least a surface of the substrate on which a film is to be formed contacted with the liquid. Since generally bubbles rise in a liquid, if the substrate is held above a region where bubbles are generated, an activated raw material can be efficiently deposited on the surface of the substrate.

Here, an example of a film forming apparatus which can be used in the process for producing an amorphous carbon film of the present invention is shown in FIG. 1. This film forming apparatus mainly comprises a reaction vessel 1 which can hold a liquid L, a bar-like plasma generating electrode 2 placed in a lower part of the reaction vessel 1, and an upper electrode 3 (or a substrate S) placed in an upper part of the reaction vessel 1 and facing the plasma generating electrode 2. The respective electrodes 2 and 3 are connected to coils, capacitors and the like, thereby incorporated in an oscillator circuit (omitted in the drawing) to which electromagnetic waves are supplied. Since electromagnetic waves are generated intensively at a fore end of the plasma generating electrode 2, a fore end portion 20 of the plasma generating electrode 2 is dielectrically heated. Since the fore end portion 20 of the plasma generating electrode 2 is placed in the liquid, heat generation of the fore end portion 20 raises the temperature of the liquid L to a boil and forms bubbles B. Namely, in the present film forming apparatus, the plasma generating electrode 2 functions not only as means for generating plasma but also as means for forming bubbles.

Moreover, although in the present film forming apparatus the conductive substrate S is used as an upper electrode 3 by being directly connected to an oscillator circuit, the substrate S can be placed between the plasma generating electrode 2 and the upper electrode 3 as long as the surface of the substrate 2 is located in a position to contact the bubbles. In this case, the shortest distance from the fore end of the plasma generating electrode 2 to the upper electrode 3 is preferably 0.5 to 50 mm. In addition, the shortest distance from the fore end of the plasma generating electrode 2 to the substrate S is preferably 0.5 to 50 mm.

The fore end portion 20 of the plasma generating electrode 2 can be sharp-pointed as shown in FIG. 1 or curved, so that bubbles and plasma can be generated efficiently. Moreover, the film thickness of an amorphous carbon film can be averaged by moving the substrate S with the shortest distance from the fore end of the plasma generating electrode 2 to the surface of the substrate S kept constant. Furthermore, a film can be formed on a surface of a large area substrate by placing a plurality of plasma generating electrodes 2 in a manner to keep the shortest distance from fore ends of the plasma generating electrodes 2 to the surface of the substrate S constant.

Moreover, the pressure of the reaction vessel 1 can be reduced by employing a evacuate means 9. Owing to the depressurization of the reaction vessel 1, bubbles and plasma can be generated easily. In this case, the pressure is desirably from 1 to 600 hPa. Note that since depressurization is particularly effective at a start of bubbles and plasma generation, the pressure can be returned to normal once the generation of bubbles and plasma becomes stable.

In the process for producing an amorphous carbon film of the present invention, an organic compound contained in a liquid comprises one or more selected from phenols and alcohols having a carbon number of from 1 to 12. Since relatively small molecular phenols and alcohols having a carbon number of from 1 to 12 are employed as an organic compound to be a raw material, a hard amorphous carbon film having a hardness of 6 GPa or more can be produced. Moreover, since some are singly in liquid form and some are highly soluble in water, alcohols and phenols are easy to handle in liquid form and suitable for the process for producing an amorphous carbon film of the present invention in which a raw material is supplied in liquid form.

Moreover, from phenols and alcohols having a carbon number of from 1 to 12, one kind of these organic compounds can be selected and used singly or two or more kinds of these organic compounds can be selected and used by mixing them. Furthermore, the selected organic compound(s) can be mixed with other organic compounds such as hydrocarbons. For example, if film forming is carried out by using a mixed solution of alcohol and silicone oil, a silicon-containing amorphous carbon film, which is a hard film, can be formed.

As the organic compound, it is preferable to employ alcohols and phenols which are in liquid form under film forming conditions (temperature, pressure, and so on). Especially, the organic compound desirably comprises one or more selected from alcohols and phenols which are in liquid form at room temperature. Alcohols and phenols are not particularly limited as long as they are in liquid form during film forming, but preferably have kinematic viscosity of 100 mm$^2$/sec or less. A liquid having a high viscosity is not preferable because bubbles and plasma are sometimes difficult to be generated.

Moreover, the liquid is desirably an aqueous solution comprising water as a solvent and one or more selected from alcohols and phenols as a solute. Alcohols and phenols have one or more hydroxyl groups. Since the hydroxyl groups form sufficient hydrogen bonds with water molecules, alcohols and phenols are soluble in water. In particular, phenols, alcohols having a small carbon number and polyhydric alcohols are easily soluble in water. Therefore, if solved in water, even alcohols and phenols which are in the solid state at room temperature or have a high viscosity can be suitably used in the process for producing an amorphous carbon film of the present invention.

Moreover, in the process for producing an amorphous carbon film of the present invention, since peripheries of bubbles are surrounded by a high density raw material as mentioned above, when plasma is generated inside the bubbles, the raw material is efficiently activated. Therefore, if an aqueous solution comprising water as a solvent and alcohols and phenols as a solute is employed, the amount of the raw material to be activated inside the bubbles can be regulated. Namely, as the aqueous solution has a lower concentration (the amount of the raw material surrounding the bubbles is smaller), a rate of forming a film is lower. Since the rate of forming a film can be adjusted by a concentration of the aqueous solution, a film of desired thickness or a film of an extremely small thickness can be easily formed without finely adjusting time for forming the film.

Furthermore, water, even if contained in a liquid, does not largely change the composition of a film to be deposited, which is different from organic solvents. Therefore, there is no big difference in composition or hardness between an amorphous carbon film formed without dissolving a raw material in water and an amorphous carbon film formed by employing an aqueous solution of the same raw material.

Alcohols and phenols are preferably represented by R—OH, wherein R is preferably any of an alkyl group such as methyl, ethyl, propyl, butyl, t-butyl, pentyl, hexyl and heptyl, an alkenyl group such as vinyl, allyl, 1-propenyl, 1, 2 or 3-butenyl, 1 to 5-hexenyl, cyclopentenyl, cyclohexenyl and cyclooctenyl, a cycloalkyl group such as cyclopropyl, cyclobutyl, cyclopentyl and cyclohexyl, an aryl group such as phenyl, naphthyl, tolyl, anisyl and xylyl, and an aralkyl group such as benzil, phenethyl, naphthylmethyl and naphthylethyl.

Concretely, it is possible to use methanol, ethanol, propanol, isopropanol, butanol, isobutanol, pentanol, hexanol, octanol, 2-ethylhexanol, cyclohexanol, benzyl alcohol, allyl alcohol, phenol, cresol, xylenol, ethylphenol, isopropylphenol, p-tertiary butylphenol, n-octylphenol and so on.

Moreover, the alcohols are preferably acyclic lower monohydric alcohols (lower monohydric aliphatic alcohols) having a carbon number of from 1 to 5. Since the acyclic lower monohydric alcohols having a carbon number of from 1 to 5 are in liquid form at room temperature and soluble in water, these alcohols are suitable as a raw material for the process for producing an amorphous carbon film of the present invention. Of the lower monohydric alcohols, it is preferable to employ methanol, ethanol, n-propanol and isopropanol. Since these alcohols are in liquid form at room temperature and their solubility in water is unlimited, these alcohols are especially preferable as a raw material for the process for producing an amorphous carbon film of the present invention.

Moreover, as mentioned above, as the organic compound contains a larger carbon number, the organic compound is more easily polymerized in plasma and a soft amorphous carbon film containing much hydrogen tends to be formed. If the abovementioned lower monohydric alcohols having a carbon number of from 1 to 3 are employed as a raw material, the raw material is decomposed without being polymerized and an amorphous carbon film of a high hardness can be produced.

The process for producing an amorphous carbon film of the present invention is not limited to the above-mentioned embodiments. Namely, the process for producing an amorphous carbon film of the present invention can be carried out in a variety of forms modified and improved by those skilled in the art without departing the gist of the present invention.

Amorphous carbon films were formed based on the above-mentioned embodiments. Hereinafter, examples of the process for producing an amorphous carbon film of the present invention will be described together with comparative examples by using figures and tables. Hereinafter, amorphous carbon films will be abbreviated as DLC films.

In the following examples 1 to 16 and comparative examples 1 and 2, DLC films were formed by using a film forming apparatus shown in FIG. 1. Hereinafter, the construction of the film forming apparatus will be described.

The film forming apparatus comprises a reaction vessel 1 which can hold a liquid L, a plasma generating electrode 2 placed in a lower part of the reaction vessel 1, and an upper electrode 3 (a substrate S) placed in an upper part of the reaction vessel 1 and facing the plasma generating electrode 2.

The reaction vessel 1 comprises a vessel body formed of quarts glass and having a hollow cylindrical shape, and closing members for closing a lower open end and an upper open end of the vessel body each formed of stainless steel and having a roughly circular disk shape. To a center portion of the closing member for closing the lower open end, the plasma generating electrode 2 formed of an aluminum alloy and having a rod shape (diameter: 3 mm) is fixed by way of a cylindrical ceramic insulating member 12. One end of the plasma generating electrode 2 is sharp-pointed and the fore end portion 20 is housed in the insulating member 12 and placed in such a manner to protrude into the inside of the reaction vessel 1.

The inside of the reaction vessel 1 is filled with a liquid L as a raw material and the fore end portion 20 of the plasma generating electrode 2 is located in the liquid L. The substrate S, which is the upper electrode 3, is held above the plasma generating electrode 2 in such a manner that its film forming surface and the fore end of the plasma generating electrode 2 face each other at a distance of 3 mm. The substrate S is a plate (20 mm×4 mm×1 mm) formed of steel, pure aluminum or an aluminum alloy and the whole of the substrate S is immersed in the liquid L.

The plasma generating electrode 2 and the substrate S are connected to coils, capacitors and the like, thereby incorporated in an oscillator circuit (omitted in the drawing) to which high frequency waves (=radio frequency waves) are supplied. Note that the substrate S is held by a conductive retainer fixed through a ceramic cylinder 13 to the closing member for closing the upper open end. The substrate S is connected to the oscillator circuit by way of this retainer.

The reaction vessel 1 is housed in an outer vessel 91 which is slightly larger than the reaction vessel 1. The outer vessel 91 has a similar construction to that of the reaction vessel 1, except for having a vacuum pump 90 connected to the outer vessel by way of an exhaust gas passage 95.

Example 1

A DLC film of Example 1 was formed by using the above film forming apparatus by the following procedures.

Methanol as a raw material (a liquid L) and a steel product (molybdenum high speed steel: SKH51, surface roughness (ten-point average roughness "Rz" defined by JIS): 0.2 µmRz) as a substrate S were prepared and placed in the film forming apparatus.

First of all, the vacuum pump 90 was turned on to depressurize the inside of the outer vessel 91 to about 100 hPa. Next, a high-frequency power source was switched on at an output power of 150 W to supply high frequency waves at 27.12 MHz to the plasma generating electrode 2. Thus, fine bubbles inside which plasma was generated were generated in the liquid L. The bubbles rose in the liquid L from the peripheries of the plasma generating electrode 2 and a DLC film was formed on a surface of the substrate S with which the bubbles were contacted. In this case, film forming time (time from plasma generation to stop) was set at 15 seconds.

Since the substrate S was not heated during the film forming, the temperature of the substrate S during the film forming was about room temperature.

Example 2

A DLC film of Example 2 was formed in a similar way to that of Example 1, except that the raw material (the liquid L) was changed to ethanol.

Example 3

A DLC film of Example 3 was formed in a similar way to that of Example 1, except that the raw material (the liquid L) was changed to 1-propanol.

Example 4

A DLC film of Example 4 was formed in a similar way to that of Example 1, except that the raw material (the liquid L) was changed to 2-propanol.

Example 5

A DLC film of Example 5 was formed in a similar way to that of Example 1, except that the substrate S was changed to a plate formed of an aluminum alloy (an Al—Si alloy: A4032, surface roughness: 0.3 µmRz).

Example 6

A DLC film of Example 6 was formed in a similar way to that of Example 5, except that the raw material (the liquid L) was changed to ethanol.

Example 7

A DLC film of Example 7 was formed in a similar way to that of Example 5, except that the raw material (the liquid L) was changed to 1-propanol.

Example 8

A DLC film of Example 8 was formed in a similar way to that of Example 5, except that the raw material (the liquid L) was changed to 2-propanol.

Comparative Example 1

A DLC film of Comparative Example 1 was formed in a similar way to that of Example 1, except that the raw material (the liquid L) was changed to dodecane.

Comparative Example 2

A DLC film of Comparative Example 2 was formed in a similar way to that of Example 5, except that the raw material (the liquid L) was changed to dodecane.

[Evaluation]

For evaluation of the DLC films obtained by the above procedures, hardness measurement, film thickness measurement and Raman spectroscopic analysis were carried out on the DLC films.

The hardness was measured by nanoindentation technique. Employed as a nanoindenter was TriboScope produced by HYSITORON Inc. attached to an atomic force microscope (SPM9500J2 produced by SHIMADZU). Note that nanoindentation technique allows measuring the hardness of DLC films alone without being affected by substrates. Moreover, the film thickness was measured by cutting each substrate S having a DLC film thereon in the direction of thickness and observing its cross section by a scanning electron microscope (SEM).

Raman spectroscopic analysis was carried out by radiating an argon ion laser (wavelength: 514.5 nm) to the DLC films and measuring spectra of scattered light excited by the laser radiation.

The film thickness and hardness of the respective DLC films are shown in Table 1 together with the film forming conditions. Furthermore, the Raman spectroscopic analysis results of the DLC films of Example 1 and Comparative Example 1 are respectively shown in FIG. 2 and FIG. 3.

TABLE 1

| | RAW MATERIAL | SUBSTRATE | FILM FORMING TIME [sec] | FILM THICKNESS [um] | HARDNESS [GPa] |
| --- | --- | --- | --- | --- | --- |
| EXAMPLE 1 | METHANOL | SKH51 | 15 | 4.3 | 14.1 |
| EXAMPLE 2 | ETHANOL | SKH51 | 15 | 4.7 | 11.9 |
| EXAMPLE 3 | 1-PROPANOL | SKH51 | 15 | 5.6 | 12.1 |
| EXAMPLE 4 | 2-PROPANOL | SKH51 | 15 | 5.5 | 11.4 |
| EXAMPLE 5 | METHANOL | A4032 | 15 | 3.9 | 13.5 |
| EXAMPLE 6 | ETHANOL | A4032 | 15 | 5.6 | 12.6 |
| EXAMPLE 7 | 1-PROPANOL | A4032 | 15 | 5.2 | 12.3 |
| EXAMPLE 8 | 2-PROPANOL | A4032 | 15 | 6.1 | 11.8 |
| COMP. EX. 1 | DODECANE | SKH51 | 15 | 9.8 | 7.6 |
| COMP. EX. 2 | DODECANE | A4032 | 15 | 10.6 | 6.9 |

In Examples 1 to 8 and Comparative Examples 1 and 2, DLC films of about 4 to 10 µm could be formed in 15 seconds. Furthermore, even the DLC films of Examples 1 to 8 using alcohols having a carbon number of from 1 to 3 as raw materials could be formed at high speed of about 260 to 400 nm/sec.

Figure 2:
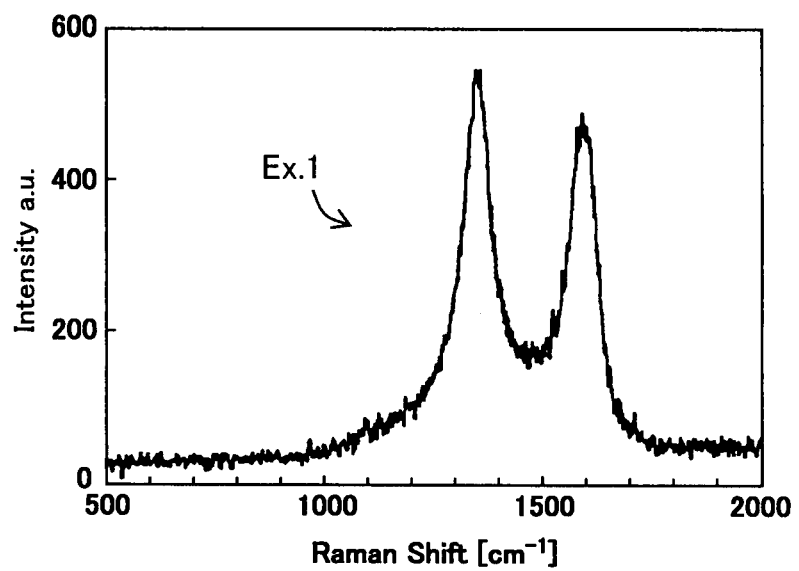
FIG. 2 is a graph showing a Raman spectroscopic analysis result of an amorphous carbon film of Example 1.

The DLC films of Examples 1 to 8 using alcohols having a carbon number of from 1 to 3 had high hardness of 11 GPa or more. Especially, the DLC films of Example 1 and Example 5 using an alcohol having a carbon number of one (methanol) as a raw material had very high hardness of 13 GPa or more. According to the Raman spectroscopic analysis, DLC films of high hardness, such as that of Example 1, showed a relatively high intensity of D band compared to that of G band (FIG. 2). Note that G band is a peak observed around 1550 cm$^{-1}$ and derived from sp² bond (graphite) and D band is a peak observed around 1330 cm⁻¹ and derived from Sp³ bond (diamond).

Figure 3:
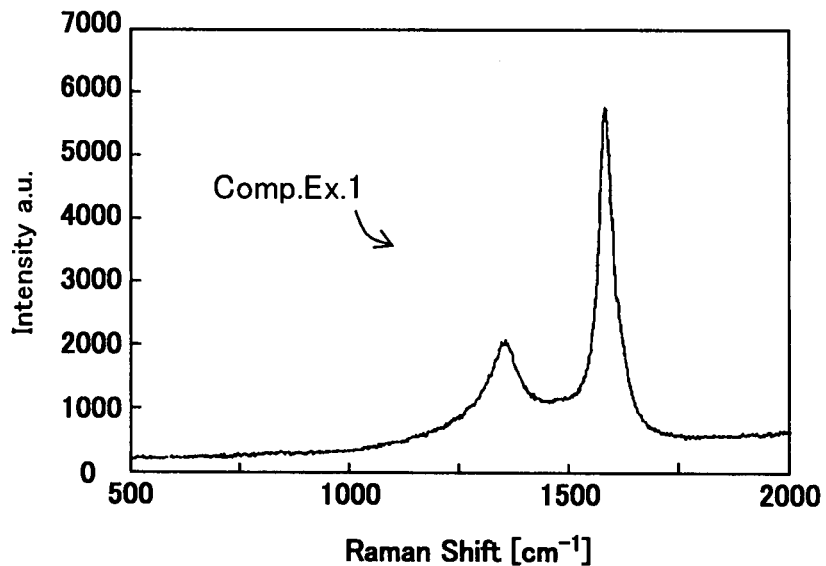
FIG. 3 is a graph showing a Raman spectroscopic analysis result of an amorphous carbon film of Comparative Example 1.

Note that, for reference, a Raman spectroscopic analysis result of the DLC film of Comparative Example 1 is shown in FIG. 3. The DLC film of Comparative Example 1 using a hydrocarbon having a carbon number of 12 as a raw material was hard but had a lower hardness than that of the DLC film of Example 1. In DLC films such as that of Comparative Example 1, the intensity of D band is relatively low compared to that of G band.

Examples 9 to 12

DLC films of Examples 9 to 12 were formed in a similar way to that of Example 1, except that the raw material (the liquid L) was changed to aqueous methanol solutions prepared by mixing methanol and pure water and that the film forming time was set at 30 seconds. The concentration of the aqueous methanol solutions (the weight ratio of methanol to pure water) used in Examples 9 to 12 is shown in Table 2 together with film forming conditions.

In addition, the DLC films of Examples 9 to 12 were subjected to film thickness measurement and hardness measurement in a similar way to the above. Measurement results are shown in Table 2 together with the results of Example 5.

TABLE 2

|  | RAW MATERIAL (METHANOL:PURE WATER) | SUBSTRATE | FILM FORMING TIME [sec] | FILM THICKNESS [um] | HARDNESS [GPa] |
| --- | --- | --- | --- | --- | --- |
| EXAMPLE 5 | 100:0 | A4032 | 15 | 3.9 | 13.5 |
| EXAMPLE 9 | 90:10 | A4032 | 30 | 8 | 10.6 |
| EXAMPLE 10 | 70:30 | A4032 | 30 | 5.5 | 11.8 |
| EXAMPLE 11 | 50:50 | A4032 | 30 | 2 | 12.9 |
| EXAMPLE 12 | 10:90 | A4032 | 30 | 0.5 | 13.1 |

Examples 13 to 16

DLC films of Examples 13 to 16 were formed in a similar way to that of Example 1, except that the raw material (the liquid L) was changed to aqueous ethanol solutions prepared by mixing ethanol and pure water and that the film forming time was set at 30 seconds. The concentration of the aqueous ethanol solutions (the weight ratio of ethanol to pure water) used in Examples 13 to 16 is shown in Table 3 together with film forming conditions.

In addition, the DLC films of Examples 13 to 16 were subjected to film thickness measurement and hardness measurement in a similar way to the above. Measurement results are shown in Table 3 together with the results of Example 6.

TABLE 3

|  | RAW MATERIAL (ETHANOL:PURE WATER) | SUBSTRATE | FILM FORMING TIME [sec] | FILM THICKNESS [um] | HARDNESS [GPa] |
| --- | --- | --- | --- | --- | --- |
| EXAMPLE 6 | 100:0 | A4032 | 15 | 5.6 | 12.6 |
| EXAMPLE 13 | 90:10 | A4032 | 30 | 9 | 10.8 |
| EXAMPLE 14 | 70:30 | A4032 | 30 | 6.5 | 10.6 |
| EXAMPLE 15 | 50:50 | A4032 | 30 | 2 | 11.6 |
| EXAMPLE 16 | 10:90 | A4032 | 30 | 1 | 11.9 |

As can be understood from Table 2 and Table 3, as the amount of alcohols used was smaller, the thickness of the obtained DLC film was smaller. For example, in Example 12 using a raw material in which methanol:pure water was 10:90, the film forming rate was about 17 nm/sec. Thus, a thin film of nanometer order can be formed easily.

Moreover, the DLC films of Examples 9 to 12 and Examples 13 to 16 were not largely different in hardness from those of Example 5 and Example 6 using alcohols (without mixing them with pure water) as raw materials. Namely, the use of aqueous alcohol solutions gives no big effect on the hardness of DLC films to be obtained.

Example 17

Figure 4:
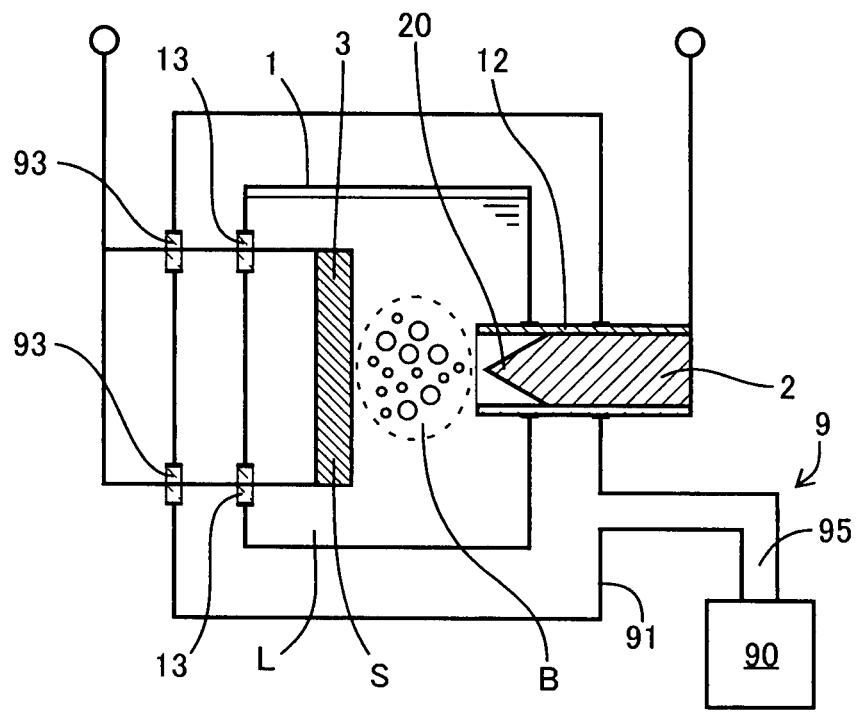
FIG. 4 is an explanatory view schematically showing a film forming apparatus used in the process for producing an amorphous carbon film of the present invention.

In Example 17, in the film forming apparatus shown in FIG. 1, a DLC film was formed by placing a center axis of the cylindrical reaction vessel 1 perpendicularly to the gravitational direction. Namely, the film forming apparatus of the present example was used by inclining the film forming apparatus shown in FIG. 1 at an angle of 90°, and, except for this, had a similar construction to that of the film forming apparatus shown in FIG. 1. The film forming apparatus is shown in FIG. 4. A DLC film was formed by using the film forming apparatus shown in FIG. 4 by the following procedures.

Methanol as a raw material (a liquid L) and a steel product (SKH51, surface roughness: 0.2 μmRz) as a substrate S were prepared and placed in the film forming apparatus.

First of all, the vacuum pump 90 was turned on to depressurize the inside of the outer vessel 91 to about 100 hPa. Next, the high-frequency power source was switched on at an output power of 150 W to supply high frequency waves at 27.12 MHz to the plasma generating electrode 2. Thus, fine bubbles inside which plasma was generated were generated in the liquid L. The bubbles appeared from the peripheries of the plasma generating electrode 2 and came in contact with the surface of the substrate S. Then, a DLC film was formed on the surface of the substrate S with which the bubbles were contacted. In this case, film forming time (time from plasma generation to stop) was set at 15 seconds.

Since the substrate S was not heated during the film forming, the temperature of the substrate S during the film forming was about room temperature.

Example 18

A DLC film of Example 18 was formed in a similar way to that of Example 17, except that the substrate S was changed to a plate formed of pure aluminum (A1050, surface roughness: 1 μmRz).

[Evaluation]

The DLC films of Example 17 and Example 18 were subjected to film thickness measurement and hardness measurement in a similar way to the above. Measurement results are shown in Table 4.

TABLE 4

|  | RAW MATERIAL | SUBSTRATE | FILM FORMING TIME [sec] | FILM THICKNESS [um] | HARDNESS [GPa] |
|---|---|---|---|---|---|
| EXAMPLE 17 | METHANOL | SKH51 | 15 | 1.7 | 12.6 |
| EXAMPLE 18 | METHANOL | A1050 | 15 | 2.3 | 10.9 |

In Example 17 and Example 18, DLC films could be formed even when the substrate S and the plasma generating electrode 2 were located at the positions shown in FIG. 4. In the film forming apparatus shown in FIG. 4, the surface of the substrate S was located in parallel to a bubble rising direction. Therefore, in Examples 17 and 18, film forming rates were lower than that of Example 1 in which a film was formed by placing the substrate S above the rising bubbles (FIG. 1), but DLC films of about 2 μm could be formed in 15 seconds.

Figure 5:
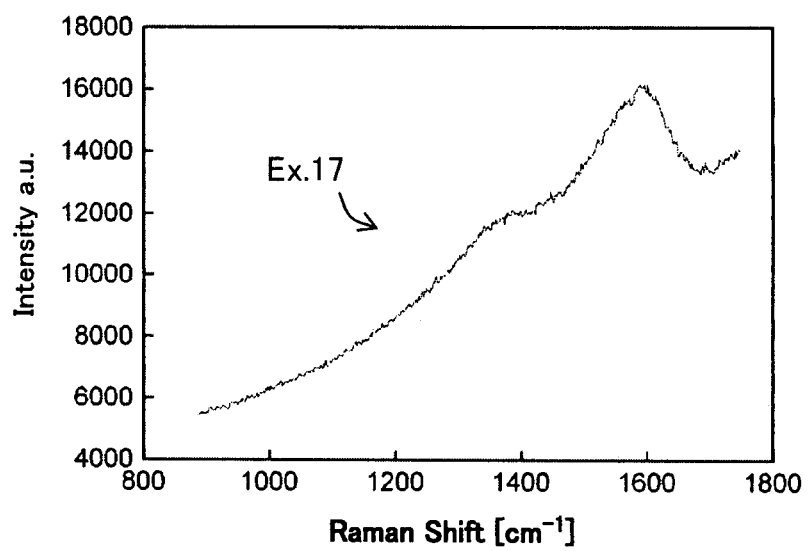
FIG. 5 is a graph showing a Raman spectroscopic analysis result of an amorphous carbon film of Example 17.

Each of the DLC films showed high hardness of more than 10 GPa. Besides, a Raman spectroscopic analysis result of the DLC film of Example 17 is shown in FIG. 5. In FIG. 5, G band and D band were observed and the intensity of D band was relatively low compared with that of G band. However, the ratio of the intensity of D band to that of G band was larger than that of Comparative Example 1 (FIG. 3).

Comparative Example 3

A DLC film of Comparative Example 3 was formed by high-frequency plasma CVD (=radio-frequency plasma CVD: hereinafter abbreviated as "RFPCVD").

Formation of the DLC film of Comparative Example 3 was carried out by using a commercially available plasma CVD apparatus at an electric power of 300 W, a vacuum degree of 0.001 Torr (0.133 Pa) and a substrate temperature of 200° C. for 3600 seconds. The film thickness and hardness of the obtained DLC film is shown in Table 5 together with the results of Example 1.

Comparative Example 4

A DLC film of Comparative Example 4 was formed by unbalanced magnetron sputtering (hereinafter abbreviated as "UBMS").

Formation of the DLC film of Comparative Example 4 was carried out by using a commercially available sputtering apparatus at an electric power of 300 W, a vacuum degree of $3 \times 10^{-6}$ Torr ($3.99 \times 10^{-4}$ Pa) and a substrate temperature of 300° C. for 7200 seconds. The film thickness and hardness of the obtained DLC film is shown in Table 5 together with the results of Example 1 and Comparative Example 3.

In Comparative Example 3 and Comparative Example 4, since a hydrocarbon having a carbon number of one (methane) or graphite was used as a raw material, hard films of 13 GPa or more were obtained. However, since the raw materials to be supplied had low density, reaction rates were low and it took a very long time to form the films. Note that the film forming rates of the respective comparative examples were not more than 1 nm/sec.

The invention claimed is:

1. A process for producing a thin, high hardness amorphous carbon film, comprising:
   generating bubbles in a salt-free liquid containing an organic compound while radiating electromagnetic waves continuously from an electrode disposed in the salt-free liquid to the bubbles so as to generate plasma inside the bubbles, wherein the salt-free liquid is an aqueous solution comprising water as a solvent and the organic compound comprises one or more selected from the lower monohydric alcohols having a carbon number of from 1 to 3 as a solute;
   moving the plasma within the bubbles through the salt-free liquid from the electrode to a substrate disposed in the salt-free liquid;
   contacting a surface of the substrate with the bubbles, so as to form an amorphous carbon film on the surface of the substrate, the formed amorphous carbon film having a thickness from 0.5 μm to 8 μm and a hardness of 11 GPa or more; and
   regulating the weight ratio of solute:solvent within a range from 10:90 to 50:50 so as to adjust the rate of forming the amorphous carbon film to deposit a film of the desired thickness and hardness.

2. A process for producing a thin, high hardness amorphous carbon film recited in claim 1, wherein pressure is reduced at least at a start of the generation of the bubbles and the plasma and the generation of the bubbles and the plasma is started under 1 to 600 hPa.

3. A process for producing a thin, high hardness amorphous carbon film recited in claim 1, wherein pressure is reduced at least at a start of the generation of the bubbles and the plasma, and thereafter the bubbles and the plasma are generated under normal pressure.

4. A process for producing a thin, high hardness amorphous carbon film recited in claim 1, wherein the amorphous carbon film has a hardness of 13 GPa or more.

TABLE 5

|  | FILM FORMING PROCESS | RAW MATERIAL | SUBSTRATE | FILM FORMING TIME [sec] | FILM THICKNESS [um] | HARDNESS [GPa] |
|---|---|---|---|---|---|---|
| EXAMPLE 1 | — | METHANOL | SKH51 | 15 | 4.3 | 14.1 |
| COMP. EX. 3 | RFPCVD | METHANE | SKH51 | 3600 | 3.1 | 14.2 |
| COMP. EX. 4 | UBMS | GRAPHITE | SKH51 | 7200 | 3.3 | 13.7 |

5. A process for producing a thin, high hardness amorphous carbon film recited in claim 1, wherein the liquid contains one or more other organic compounds from hydrocarbons and silicone oil.

6. A process for producing a thin, high hardness amorphous carbon film recited in claim 1, wherein the substrate is selected from the group consisting of metal, ceramic, resin, paper and wood.

7. A process for producing a thin, high hardness amorphous carbon film recited in claim 1, wherein the step of contacting a surface of a substrate with the bubbles so as to form an amorphous carbon film on the surface of the substrate comprises positioning the substrate in the salt-free liquid above the generated plasma bubbles, allowing the plasma bubbles to rise in the salt-free liquid towards the substrate, and contacting the plasma bubbles with the surface of the substrate so as to deposit the amorphous carbon film on the surface of the substrate.

8. A process for producing a thin, high hardness amorphous carbon film recited in claim 1, wherein the electromagnetic waves and the bubbles are generated by a plasma generating electrode.

9. A process for producing a thin, high hardness amorphous carbon film recited in claim 8, wherein the distance between the substrate and the plasma generating electrode is between 0.5 and 50 mm.

10. A process for producing a thin, high hardness amorphous carbon film recited in claim 8, wherein the plasma generating electrode has a sharp-pointed or curved side positioned in the direction of the substrate.

11. A process for producing a thin, high hardness amorphous carbon film recited in claim 1, wherein the plasma generating electrode comprises aluminum alloy.

12. A process for producing a thin, high hardness amorphous carbon film recited in claim 1, wherein the organic compound has a kinematic viscosity of 100 $mm^2/sec$ or less.

13. A process for producing a thin, high hardness amorphous carbon film recited in claim 1, wherein the organic compound comprises methanol.

14. A process for producing a thin, high hardness amorphous carbon film recited in claim 1, wherein the amorphous carbon film has a thickness from 0.5 µm to 8 µm.

15. A process for producing a thin, high hardness amorphous carbon film recited in claim 1, wherein the amorphous carbon film has a thickness from 0.5 µm to 2 µm.

16. A process for producing a thin, high hardness amorphous carbon film recited in claim 1, wherein the amorphous carbon film has a hardness of 11 GPa or more.

17. A process for producing a thin, high hardness amorphous carbon film recited in claim 1, wherein the bubbles contact the surface of the substrate for from 15 to 30 seconds.

18. A process for producing a thin, high hardness amorphous carbon film recited in claim 1, wherein the weight ratio of solute:solvent is from 10:90 to less than 50:50.

* * * * *